(12) United States Patent
Krämer et al.

(10) Patent No.: US 7,879,762 B2
(45) Date of Patent: Feb. 1, 2011

(54) RESISTIVE CURRENT-LIMITER DEVICE WITH HIGH-$T_c$ SUPERCONDUCTOR TRACK FORMED IN A STRIP

(75) Inventors: Hans-Peter Krämer, Erlangen (DE); Wolfgang Schmidt, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 773 days.

(21) Appl. No.: 11/664,579

(22) PCT Filed: Sep. 27, 2005

(86) PCT No.: PCT/EP2005/054856

§ 371 (c)(1),
(2), (4) Date: Apr. 4, 2007

(87) PCT Pub. No.: WO2006/037743

PCT Pub. Date: Apr. 13, 2006

(65) Prior Publication Data

US 2007/0254813 A1    Nov. 1, 2007

(30) Foreign Application Priority Data

Oct. 4, 2004    (DE) .................. 10 2004 048 647

(51) Int. Cl.
*H01L 39/24* (2006.01)
(52) U.S. Cl. .................. 505/236; 505/230; 505/231; 505/237; 505/238; 428/930
(58) Field of Classification Search .................. 505/230, 505/231, 236, 237, 238; 428/930
See application file for complete search history.

(56) References Cited

U.S. PATENT DOCUMENTS 4,921,833 A    5/1990    Takano (Continued)

FOREIGN PATENT DOCUMENTS

DE    44 34 819 C1    1/1996

(Continued)

OTHER PUBLICATIONS

International Search Report for International Application No. PCT/EP2005/054856; mailed Dec. 5, 2005.

(Continued)

*Primary Examiner*—Steven Bos
*Assistant Examiner*—Paul A Wartalowicz
(74) *Attorney, Agent, or Firm*—Staas & Halsey LLP

(57) ABSTRACT

A superconductor has a conductive path with a metallic substrate strip, a super-conductive layer made of a $AB_2CU_3O_x$ type high-$T_c$-super conductive material, at least one insulating buffer layer which is arranged therebetween, and a metallic cover layer which is arranged thereon. At least one contacting element made of a normal conductive contacting material and arranged at least on one longitudinal side of the structure between the cover layer and the substrate strip enables a predetermined normally conductive limitation of the current-limiting device to be obtained.

9 Claims, 1 Drawing Sheet

U.S. PATENT DOCUMENTS

| | | | |
|---|---|---|---|
| 5,235,309 | A | 8/1993 | Preisler et al. |
| 5,828,291 | A | 10/1998 | Baumann et al. |
| 6,251,834 | B1 * | 6/2001 | Glowacki et al. ........... 505/239 |
| 6,522,236 | B1 | 2/2003 | Ries |
| 6,552,415 | B1 | 4/2003 | Paul et al. |
| 2002/0144838 | A1 * | 10/2002 | Fritzemeier et al. ...... 174/125.1 |
| 2004/0266628 | A1 * | 12/2004 | Lee et al. .................... 505/238 |

FOREIGN PATENT DOCUMENTS

| | | | |
|---|---|---|---|
| DE | 198 36 860 | A1 | 2/2000 |
| DE | 102 26 391 | A1 | 1/2004 |
| EP | 0 292 959 | B1 | 11/1988 |
| EP | 0 523 374 | A1 | 1/1993 |
| WO | 99/33122 | | 7/1999 |

OTHER PUBLICATIONS

International Search Report, mailed Dec. 5, 2005 and issued in corresponding International Patent Application No. PCT/EP2005/054856.

German Patent Office Action issued in corresponding German Patent Application No. 10 2004 048 647.6-33.

* cited by examiner

US 7,879,762 B2

RESISTIVE CURRENT-LIMITER DEVICE WITH HIGH-$T_c$ SUPERCONDUCTOR TRACK FORMED IN A STRIP

CROSS REFERENCE TO RELATED APPLICATIONS

This application is based on and hereby claims priority to German Application No. 10 2004 048 647.6 filed on April Oct. 4, 2004, the contents of which are hereby incorporated by reference.

BACKGROUND

Described below is a resistive superconducting current-limiter device, whose conductor track is formed by a superconductor in the form of a strip, whose oxidic high-$T_c$ superconductor material is of the $AB_2Cu_3O_x$ type, with A being at least one rare earth metal including yttrium, and B being at least one alkaline earth metal. A corresponding current-limiter device is disclosed in EP 0 523 374 A1.

Superconducting metal-oxide compounds with high critical temperatures $T_c$ of above 77 K have been known since 1986, which are therefore referred to as high-$T_c$ superconductor materials, or HTS materials, and, in particular, allow a liquid-nitrogen ($LN_2$) cooling technique. Metal-oxide compounds such as these include in particular cuprates based on specific substance systems, for example of the $AB_2Cu_3Ox$ type, with A being at least one rare earth metal including yttrium, and B being at least one alkaline earth metal. The main representative of this substance system of the so-called 1-2-3-HTS type is so-called YBCO ($Y_1Ba_2Cu_3O_x$ where $6.5 \leq x \leq 7$).

The aim is to deposit this known HTS material on different substrates for different purposes, in which case the general aim is to achieve a superconductor material with as high a phase purity as possible. In particular, metallic substrates are therefore provided for conductor applications (see, for example, EP 0 292 959 A1).

With an appropriate conductor structure, the HTS material is in general not deposited directly on a mount strip which is used as a substrate; instead, this substrate strip is first of all covered with at least one thin intermediate layer, which is also referred to as a buffer layer. This buffer layer has a thickness in the order of magnitude of 1 μm and is intended on the one hand to prevent the diffusion of metal atoms from the substrate into the HTS material, which metal atoms could make the superconducting characteristics poorer. On the other hand, the buffer layer is intended to allow a textured structure of the HTS material. Appropriate buffer layers are in general composed of oxides of metals such as zirconium, cerium, yttrium, aluminum, strontium and magnesium, or mixed crystals having a plurality of these metals, and are thus electrically insulating. In a corresponding electrically conductive conductor track, a problem results as soon as the superconducting material changes to the normally conductive state (so-called "quenching"). During this process, the superconductor first of all becomes resistive in places, and thus assumes a resistance R, for example by being heated above the critical temperature $T_c$ of its superconductor material (at so-called "hot spots" or in partial quenching areas), and is in general heated further, so that the layer can burn through.

As a result of this problem, it is known for an additional metallic covering layer composed of an electrically highly conductive material that is compatible with the HTS material, such as silver or gold, to be applied as a shunt, to prevent burning through, directly on the HTS line layer. The HTS material thus makes an electrically conductive contact over an area with the metallic covering layer (see DE 44 34 819 C).

A different type of superconductor in the form of a strip is used for the current-limiter device disclosed in the initially cited EP-A1 document. In this case, the conductor track is manufactured from a superconducting plate with defined dimensions by incorporating side slots so as to produce a meandering shape. Since no normally conductive covering layer is provided in this structure, this results, as before, in a risk of burning through in the area of hot spots.

The hot spots or partial quenching areas which also occur with shunts result in the voltage being distributed non-uniformly along the superconductor layer. In contrast, the voltage U which is applied to the ends is dropped uniformly over the entire length in the substrate strip to which the superconducting layer is applied, and is at an undefined intermediate potential, if the ends are isolated from the applied voltage. In some circumstances, this can result in voltage differences from the conductor track over the buffer layer to the substrate. Because this layer is not very thick, this necessarily leads to electrical flashovers and thus to the buffer layer being destroyed at some points, possibly as well as the superconducting layer. Voltages in the order of magnitude of 20 to 100 volts are typically sufficient for a flashover with buffer layer thicknesses of 1 μm. A corresponding problem occurs in particular when the aim is to produce resistive current-limiter devices using corresponding conductor strips. This is because, in a device such as this, the transition from the superconducting state to the normally conductive state is used for current limiting in the event of a short circuit. It is not possible without problems to make the buffer layer sufficiently voltage-resistant for the normal operating voltages for devices such as these, in the kV range.

SUMMARY

An aspect is not only to prevent the risk of burning through in the area of hot spots, but also to prevent an electrical flashover on quenching in the case of current limiting when buffer layers are used in a current-limiter device having the features mentioned initially.

Accordingly, the current-limiter device having the features mentioned initially is intended to have a superconductor structure in the form of a strip which at least contains a substrate strip composed of a normally conductive substrate metal, a superconducting layer composed of the high-$T_c$ superconductor material, at least one buffer layer, which is arranged in between them and is composed of an insulating oxidic buffer material and a covering layer which is applied to the superconducting layer and is composed of a normally conductive covering metal. Moreover, the conductor structure is intended to be provided with at least one contact-making element composed of a normally conductive contact metal, at least on one longitudinal side of the structure between the covering layer and the substrate strip, with the intention of the following relationship applying to the normally conductive limiting state of the current-limiter device:

$$R_k > 3 \cdot R_L,$$

where $R_L$ is the electrical resistance of the conductor structure without the contact-making element over the entire length of the conductor track, and $R_K$ is the resistance of the at least one contact-making element over the entire length of the conductor track.

In this case, the overall length should be understood as meaning the length of the superconductor which is in the form of a strip that is available between superconductivity and normal conductivity of the current-limiter device for the switching process. The resistance $R_L$ is in this case formed from the resistance of the substrate strip, of the covering layer and the maximum possible normally conductive resistance of the superconducting layer, connected in parallel. If a plurality of contact-making elements are provided, then these likewise form a parallel circuit, with a total resistance whose value is $R_K$. This value can be selected in a known manner by the choice of material for the at least one contact-making element, or the electrical resistivity ρ of its material, and by the thickness or the available conductive cross section.

The advantages associated with this embodiment of the current-limiter device are, in particular, that the metallic substrate strip and the normally conductive covering layer, and hence also the superconducting layer which is conductively connected to it, seen in the direction in which the current is passed, are brought into electrical contact with one another, at least in the subareas along the length of the structure, and are thus at a single electrical potential, even in the case of a quench. This suppresses any flashover across the buffer layer.

In particular, the following measures can also be provided individually, or else in conjunction, for the proposed current-limiter device:

Thus, the relationship contact-making element, at least on one longitudinal side between the covering layer and the substrate strip, may be: $\rho_k/d_k > 3 \cdot (d_s/\rho_s + d_6/\rho_6)^{-1}$ where $\rho_k$, $\rho_6$ and $\rho_s$ are respectively the resistivities of the material of the contact-making element, of the covering layer and of the substrate strip, and $d_k$, $d_6$ and $d_s$ are respectively the thickness of the material of the contact-making element, of the covering layer and of the substrate strip. This is based on the assumption that the substrate strip makes the major contribution to the resistance $R_L$ of the conductor structure (without a contact-making element). This resistance must in general be sufficient to allow effective current limiting.

In general, the average thickness of the at least one contact-making element is less than 1 μm, preferably less than 0.5 μm. This is because appropriately thin layers are advantageously adequate for a sufficient galvanic connection, since they allow only a galvanic connection, but cannot carry higher currents.

In particular, gold or silver, or an alloy with the respective element, or at least one further alloying partner, can be provided as the material for the at least one contact-making element.

Appropriate contact-making elements can be applied to the longitudinal sides of the conductor structure, for example by soldering processes, or can be produced by the solder material. Since solder need be applied only to the sides, the risk of damage to the HTS material is correspondingly low.

It is particularly advantageous for the contact-making element to be in the form of a sheathing element which surrounds the conductor structure on all sides.

A sheathing element such as this may be in the form of a mesh, a surrounding winding or surrounding spinning, or a non-woven.

Instead of this, it may also be in the form of an electrochemical coating. Coatings such as these can be produced in a particularly simple manner, protecting the HTS material, since only a small thickness is required.

BRIEF DESCRIPTION OF THE DRAWINGS

These and other objects and advantages will become more apparent and more readily appreciated from the following description of the preferred exemplary embodiments, taken in conjunction with the accompanying drawings of which.

DETAILED DESCRIPTION OF THE PREFERRED EMBODIMENT

Figure 1:
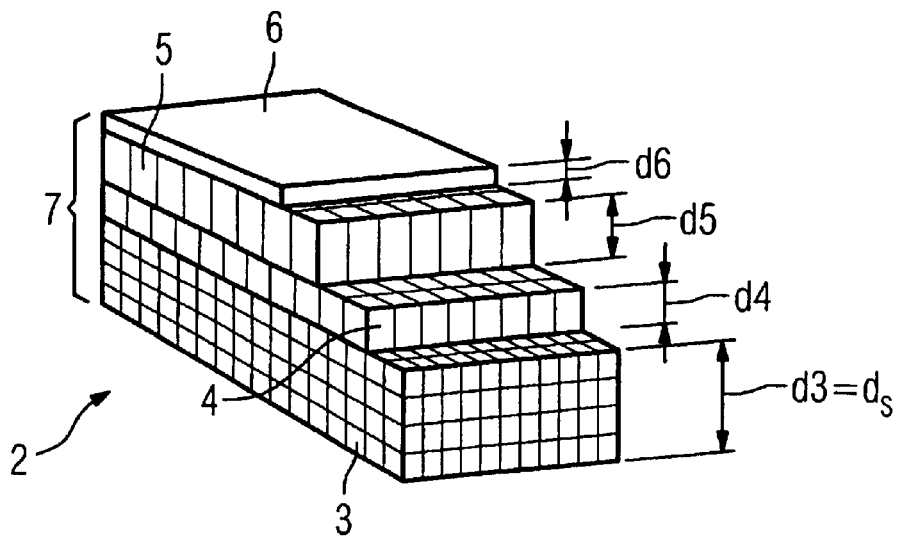
FIG. 1 is a highly schematic perspective view of the configuration of a YBCO strip conductor for the current-limiter device.

Reference will now be made in detail to the preferred embodiments, examples of which are illustrated in the accompanying drawings, wherein like reference numerals refer to like elements throughout.

In this case, corresponding parts in the figures are in each case provided with the same reference symbols.

The strip conductor that is indicated in FIG. 1 and is annotated 2 in general is based on embodiments of so-called YBCO strip conductors or "YBCO Coated Conductors" that are known per se. In the figure, 3 denotes a substrate strip composed of a normally conductive substrate metal of thickness d3 or $d_s$, 4 denotes at least one buffer layer applied to it and composed of an insulating oxidic buffer material of thickness d4, 5 denotes an HTS layer composed of YBCO of thickness d5, 6 denotes a covering layer composed of a normally conductive covering metal of thickness d6 as a protective and/or contact layer, which may also be composed of a plurality of individual layers which are in close contact with one another, and 7 shows the conductor structure formed from these four parts. Of course, the conductor structure may also have further layers that are known per se.

In this case, the parts of the abovementioned conductor structure can be formed as follows:
- a metallic substrate strip 3 composed of nickel, nickel alloys or stainless steel with a thickness d3 of about 20 to 250 μm,
- at least one buffer layer or a buffer layer system composed of one or more individual layers of oxides such as $CeO_2$ or YSZ with a thickness d4 of about 0.1 μm to 1.5 mm,
- at least one HTS layer 5 composed of YBCO with a thickness D5 of between about 0.3 and 3 μm, and
- at least one metallic covering layer 6 composed of silver, gold or copper, with a thickness d6 of between 0.1 and 1 μm. If required, the covering layer may also be composed of a plurality of metallic layers, in particular for robustness and/or armoring reasons.

A corresponding strip conductor has a width of a few millimeters to a few centimeters. Its superconducting current carrying capability is governed by the YBCO layer 5, that is to say by its critical current density, while the thermal, mechanical and normally conductive characteristics are dominated by the substrate strip 3 and the covering layer 6, because of the greater thickness $d3=d_s$. In this case, the substrate strip together with the buffer layer forms a substrate for virtually monocrystalline growth of the YBCO. The substrate strip material and the buffer layer material must not differ too greatly from YBCO in terms of the thermal coefficients of expansion and their crystallographic lattice constants. The better the match, the higher is the crack-free layer thickness, and the better the crystallinity of the YBCO. Furthermore, for high critical current densities in the $MA/cm^2$ range, it is desirable for the crystal axes in adjacent crystallites to be aligned as parallel as possible. This requires just such an alignment at least in the uppermost buffer layer in order that the YBCO can be growth heteroepitaxially. Such virtually monocrystalline flexible substrate buffer systems are preferably prepared using three processes:

- so-called "Ion Beam Assisted Deposition (IBAD)" of generally YSZ or MgO on untextured metal strips,
- so-called "Inclined Substrate Deposition (ISD)" of YSZ or MgO on untextured metal strips,
- so-called "Rolling Assisted Biaxially Textured Substrates (RABiTS)", that is to say substrates provided with cube-type texturing by rolling and heat treatment, with a heteroepitaxial buffer system.

The functional layers 4 to 6 to be deposited on the substrate strip are produced in a manner known per se by vacuum coating processes (PVD), chemical deposition from the gas phase (CVD) or from chemical solutions (CSD).

Comparatively thin intermediate layers, which are formed during the production of the structure or during the deposition of the individual layers in particular by diffusion and/or reaction processes, can, of course, be provided between the individual layers of the structure 7, as well.

In comparison to the ceramic plate conductors which are known for YBCO thin-film current limiters, the substrate strip 3 in the case of strip conductors of the type described above is electrically conductive, that is to say it can thus carry the limited current and can act as a shunt. However, in the conductor structure 7 shown in the figure, the HTS layer 5 and the substrate strip 3 would be insulated from one another. As soon as the current limiter device changes to its limiting state, that is to say becomes normally conductive and builds up a voltage along the conductor track, the breakdown field strength of the known buffer layer materials, which is in the order of magnitude of 100 kV/mm=10 V/0.1 µm, will quickly be exceeded. This means that the buffer layer 4 would then flash over in an uncontrolled manner. Therefore, a good electrical contact between the superconducting layer 5 and the metallic substrate strip 3 over the entire conductor length is advantageous for use of strip conductors in current limiters.

Figure 2:
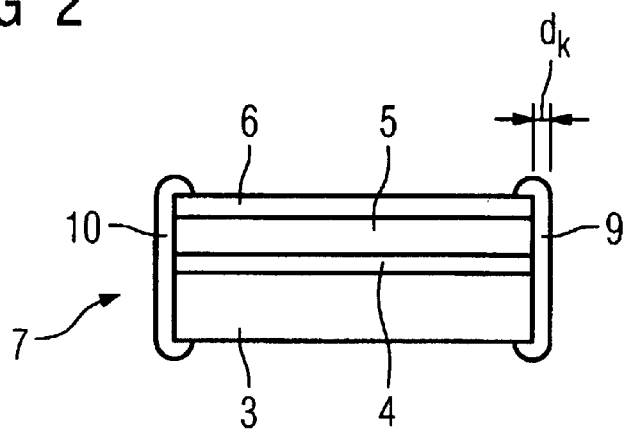
FIG. 2 is a cross-sectional view of the strip conductor, with a first embodiment of contact-making elements.

Corresponding continuous contact over the entire length can be seen from the embodiment shown in FIG. 2. In this case, the conductor structure 7 as shown in FIG. 1 is provided with a contact-making element 9 and/or 10 on at least one longitudinal side. This contact-making element is composed of an electrically highly conductive material such as gold, silver or copper, or an alloy with the respective element. This ensures a galvanic connection between the superconducting layer 5 and the normally conductive covering layer 6 which is electrically connected to it, on the one hand, and the lower normally conductive substrate strip 3 on the other hand, on the respective longitudinal side or edge. This results in these parts being at the same electrical potential when the current-limiter device is in the operating state, because of the mutual galvanic connection.

The material cross section of the contact-making elements is advantageously of such a size that, in practice, they do not act as an electrical shunt for the limited current. This can be ensured by the choice of material and/or the mean thickness of the contact-making elements. The dimension rule is:

$$R_K > 3 \cdot R_L, \text{ preferably } R_K > 10 \cdot R_L.$$

In this case, $R_L$ is the electrical resistance of the entire conductor structure 7 without the contact-making element 9, 10, measured over the entire length of the conductor track. The resistance $R_L$ is in this case composed of the resistance of the substrate strip 3, of the covering layer 6 and the maximum possible resistance of the superconducting layer 5 when it is normally conductive, connected in parallel. $R_K$ is the resistance of all the parallel-connected contact-making elements 9, 10 over this entire length.

The value $R_K$ can be selected in a known manner by the choice of material for the at least one contact-making element and the electrical resistivity $\rho_K$ of its material, as well as by the thickness $d_K$ and the available electrically conductive cross section. In general, the relationships should be as follows:

$$\rho_K/d_K > 3 \cdot (d_s/\rho_s + d_6/\rho_6)^{-1}.$$

In this case, $\rho_K$, $\rho_6$ and $\rho_s$ are the resistivities of the material of the contact-making element 9 and 10, of the covering layer 6 and of the substrate strip 3, respectively, and $d_K$, $d_6$ and $d_s$ are the overall mean thickness of the material of all of the contact-making elements, of the covering layer 6 and of the substrate strip, respectively. It is advantageous to choose even higher values for $\rho_K/d_K$ so that this variable is at least five times, and preferably at least ten times, as great as $\rho_s/d_s$ and $\rho_6/d_6$.

Taking account of the abovementioned relationship, the thickness $d_K$ is in general less than 1 µm, preferably less than 0.5 µm.

Preferably, corresponding contact-making elements 9 and 10 can be fitted to the sides of the conductor structure 7 by soldering processes. In this case, of course, the respective contact-making element 9 or 10 can also to some extent cover the upper flat surface of the covering layer 6 and/or the lower flat surface of the substrate strip 3, as indicated in FIG. 2.

Figure 3:
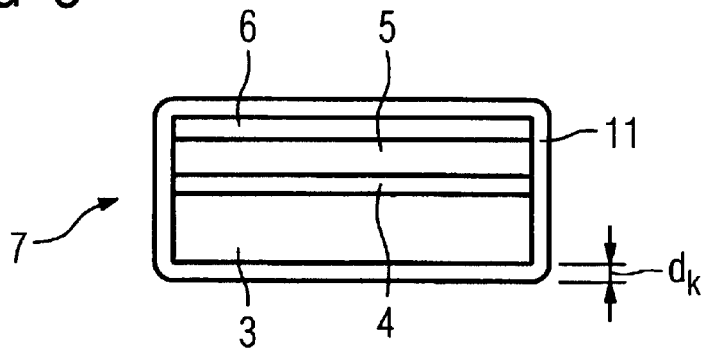
FIG. 3 is a cross-sectional view of the strip conductor with another embodiment of a contact-making element, in the form of a cross-sectional view.

As shown in FIG. 3, it is also possible and particularly advantageous for the contact-making elements to be in the form of sheathing element 11 which surrounds the conductor structure 7 on all sides. A corresponding sheathing element may for example, be produced from a normally conductive wire mesh or a surrounding wire winding, or from surrounding wire spinning, or in the form of a wire non-woven. Instead of wires it is, of course, also possible to provide strips for this purpose. A sheathing contact-making element 11 can also particularly advantageously be produced by an electrochemical coating process. Corresponding layers of little thickness $d_k$ in the abovementioned order of magnitude can be formed in a simple manner and in particular without any adverse effect on the superconducting characteristics of the superconducting layer 5.

The above exemplary embodiments have been based on YBCO as the HTS material for the superconducting layer 5. Other HTS materials of the so-called 1-2-3 type can, of course, also be used with other rare earth metals and/or other alkaline earth metals. The individual components of these materials may also be partially substituted in a manner known per se by further/other components.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV*, 358 F3d 870, 69 USPQ2d 1865 (Fed. Cir. 2004).

The invention claimed is:

1. A resistive superconducting current-limiting apparatus with a conductor track, comprising:
    a substrate strip formed of a normally conductive substrate metal;
    a superconducting layer formed of an oxidic high-$T_c$ superconductor material of $AB_2Cu_3O_x$ where A represents at least one element selected from the group consisting of yttrium and other rare earth metals, and B represents at least one alkaline earth metal;

at least one buffer layer, arranged between said substrate strip and said superconducting layer, formed of an insulating oxidic buffer material; and a covering layer, applied to said superconducting layer and formed of a normally conductive covering metal; and at least one contact-making element formed of a normally conductive material on at least one longitudinal side of said apparatus between said covering layer and said substrate strip so as not to completely cover either the covering layer or the substrate strip; and having a relationship in a normally conductive limiting state of the current-limiter device defined by $R_k > 3 \cdot R_L$, where $R_L$ is a first electrical resistance of said apparatus without the at least one contact-making element over an entire length of the conductor track, and $R_K$ is a second electrical resistance of the at least one contact-making element over the entire length of the conductor track.

2. The current-limiter device as claimed in claim 1, wherein the relationship is defined by $R_K > 10 \cdot R_L$.

3. The current-limiter device as claimed in claim 1, wherein the relationship is further defined by $\rho_k/d_k > 3 \cdot (d_s/\rho_s + d_6/\rho_6)^{-1}$, where $\rho_k$, $\rho_6$ and $\rho_s$ are respective resistivities of the at least one contact-making element, said covering layer and said substrate strip, and $d_k$, $d_6$ and $d_s$ are respective thicknesses of the at least one contact-making element, said covering layer and said substrate strip.

4. The current-limiter device as claimed in claim 2, wherein the relationship is further defined by $\rho_k > 10 \cdot (d_s/\rho_s + d_6/\rho_6)^{-1}$, where $\rho_k$, $\rho_6$ and $\rho_s$ are respective resistivities of the at least one contact-making element, said covering layer and said substrate strip, and $d_k$, $d_6$ and $d_s$ are respective thicknesses of the at least one contact-making element, said covering layer and said substrate strip.

5. The current-limiter device as claimed in claim 4, wherein an average thickness of the at least one contact-making element is less than 1 μm.

6. The current-limiter device as claimed in claim 5, wherein the average thickness of the at least one contact-making element is less than 0.5 μm.

7. The current-limiter device as claimed in claim 6, wherein the at least one contact-making element is formed of a material selected from the group consisting of gold, silver, copper and an alloy of one of gold, silver and copper.

8. The current-limiter device as claimed in claim 7, wherein the at least one contact-making element is applied by a soldering process.

9. The current-limiter device as claimed in claim 1, wherein the covering layer is formed of a plurality of metallic layers.

* * * * *